(12) United States Patent
Saito et al.

(10) Patent No.: US 10,387,116 B2
(45) Date of Patent: Aug. 20, 2019

(54) SYSTEM IDENTIFICATION DEVICE

(71) Applicant: Mitsubishi Electric Corporation, Chiyoda-ku (JP)

(72) Inventors: Mitsunori Saito, Chiyoda-ku (JP); Yurika Kanai, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 29 days.

(21) Appl. No.: 15/114,222

(22) PCT Filed: Nov. 5, 2014

(86) PCT No.: PCT/JP2014/079339
§ 371 (c)(1),
(2) Date: Jul. 26, 2016

(87) PCT Pub. No.: WO2015/118737
PCT Pub. Date: Aug. 13, 2015

(65) Prior Publication Data
US 2017/0010861 A1   Jan. 12, 2017

(30) Foreign Application Priority Data
Feb. 7, 2014   (JP) .................................. 2014-022813

(51) Int. Cl.
*G05B 13/04*   (2006.01)
*G06F 7/38*   (2006.01)
(Continued)

(52) U.S. Cl.
CPC ............. *G06F 7/38* (2013.01); *G05B 13/044* (2013.01); *H03M 13/29* (2013.01); *H03M 13/611* (2013.01)

(58) Field of Classification Search
CPC ... G05B 13/044; G05B 17/02; G06F 2217/16; G06F 7/38
See application file for complete search history.

(56) References Cited

U.S. PATENT DOCUMENTS

| 2010/0198897 A1* | 8/2010 | Yarman | G01V 11/00 708/270 |
| 2011/0125684 A1* | 5/2011 | Al-Duwaish | G06N 3/0481 706/19 |
| 2011/0161059 A1* | 6/2011 | Jain | G05B 17/02 703/2 |

FOREIGN PATENT DOCUMENTS

| JP | 61-267102 A | 11/1986 |
| JP | 4-33102 A | 2/1992 |

(Continued)

OTHER PUBLICATIONS

Lin, A.N., "System Identification for Determination of Dynamic Properties from Forced-Vibration Testing", Experimental Techniques, vol. 9, Issue 11, pp. 34-37, 1985.*

(Continued)

*Primary Examiner* — Matthew D Sandifer
(74) *Attorney, Agent, or Firm* — Oblon, McClelland, Maier & Neustadt, L.L.P.

(57) ABSTRACT

A system identification device includes: a direct feedthrough term identification unit that receives an impulse response of a dynamic system; a block Hankel matrix generation unit; a singular value decomposition unit that, by singular value decomposition of the block Hankel matrix, outputs a first orthogonal matrix, a second orthogonal matrix, and a singular value; a system dimension determination unit that, on the basis of the first orthogonal matrix, second orthogonal matrix, singular value, and search range, identifies a system matrix other than a direct feedthrough term, and from a comparison of the actual system characteristics and system characteristics calculated on the basis of the system matrix and direct feedthrough term, determines the system dimension; and a system matrix identification unit that identifies a system matrix other than the direct feedthrough term on the (Continued)

basis of the first orthogonal matrix, second orthogonal matrix, singular value, and system dimension.

17 Claims, 6 Drawing Sheets

(51) Int. Cl.
　　　*H03M 13/29* 　　　(2006.01)
　　　*H03M 13/00* 　　　(2006.01)

(56) References Cited

FOREIGN PATENT DOCUMENTS

| JP | 2005-50057 A | 2/2005 |
|---|---|---|
| JP | 2005-78559 A | 3/2005 |
| JP | 2006-195543 A | 7/2006 |
| JP | 2007-260504 A | 10/2007 |
| JP | 2008-287344 A | 11/2008 |

OTHER PUBLICATIONS

International Search Report dated Feb. 3, 2015 in PCT/JP2014/079339, filed Nov. 5, 2014.

Yoshito Hirai, et al., "Model Reduction for Linear Time-Invariant Discrete-Time Systems Using Matrix Inequalities", Proceedings of the 48th Annual Conference of the Institute of Systems, Control and Information Engineers (ISCIE), May 19-21, 2004, pp. 165-166 (with English Abstract).

Hiroshi Oku, "Identification Experiment and Control Design of an Inverted Pendulum System via Closed-Loop Subspace Model Identification", Journal of the Society of Instrument and Control Engineers, vol. 49, No. 7, Jul. 10, 2010, pp. 457-462.

Gabriel Elkaim, et al., "System Identification of a Farm Vehicle Using Carrier-Phase Differential GPS", Proceedings of the 9th International Technical Meeting of the Satellite Division of the Institute of Navigation, Sep. 20, 1996, pp. 485-494.

Takashi Kida, "Attitude Control Technology of Large Spacecraft", Journal of the Society of Instrument and Control Engineers, vol. 35, No. 11, Nov. 10, 1996, pp. 833-836.

Hayato Tsuiki, et al., "Active Vibration Control Based on Robust Control Theory", Report of the Meeting, The Acoustical Society of Japan, The Acoustical Society of Japan (ASJ), Mar. 17, 2000, pp. 653-654.

Akira Katayama, "Approach from System Identification-Subspace Method", Asakura Bookstore, Feb. 2004, pp. 102-107 (with English Translation).

* cited by examiner

SYSTEM IDENTIFICATION DEVICE

FIELD

The present invention relates to a system identification device.

BACKGROUND

For example, a device based on a method of Ho-Kalman is disclosed in Non Patent Literature 1 as a conventional system identification device using an impulse response. In this method, a direct feedthrough term $D_d$ of a system is determined from $G_0$, and a block Hankel matrix $H_{kl}$ is generated from $G_1, G_2, \ldots$ based on an impulse response $(G_0, G_1, G_2, \ldots)$ of a dynamic system delineated by a linear discrete-time system $(A_d, B_d, C_d, D_d)$. Subsequently, singular value decomposition is applied to the block Hankel matrix $H_{kl}$, the number of singular values having significant values is determined to be a system dimension, and an extended observability matrix $O_k$ and an extended reachability matrix $C_l$ are calculated from the determined system dimension and a result of singular value decomposition. Finally, the linear discrete-time system $(A_d, B_d, C_d, D_d)$ that delineates the dynamic system is identified by calculating system matrices $A_d$, $B_d$, and $C_d$ based on the extended observability matrix $O_k$ and the extended reachability matrix $C_l$.

In addition, for example, a plant modeling device is disclosed in Patent Literature 1 as another example of a conventional system identification device using an impulse response. In this plant modeling device, the above-described method of Ho-Kalman is applied to an impulse response $(G_0, G_1, G_2, \ldots)$ of a dynamic system. However, two types of methods below are selectively applied as a method of determining a system dimension. A first system dimension determination method is a method of displaying a relation between a singular value and a degree corresponding to the singular value in a logarithmic scale on a graphic terminal, and determining the number of singular values having significant values, that is, a system dimension by an operator. A second system dimension determination method is a method of applying an evaluation function based on a rate of change of a singular value and observation noise, and automatically determining a dimension, at which the evaluation function is the smallest, to be a system dimension.

In such a system identification device using an impulse response, a system dimension is determined from the number of singular values having significant values.

CITATION LIST

Patent Literature

Patent Literature 1: Japanese Patent Application Laid-Open No. S61-267102

Non Patent Literature

Non Patent Literature 1: "APPROACH FROM SYSTEM IDENTIFICATION-SUBSPACE METHOD" by Akira Katayama, Asakura Bookstore, February in 2004, p. 102-107

SUMMARY

Technical Problem

However, according to the above-described technology, a singular value of a block Hankel matrix calculated from an actual impulse response may gradually and monotonously decrease in some cases. In this case, a boundary between a singular value having a significant value and a singular value corresponding to a minute value that can be ignored is unclear. For this reason, the conventional system identification device according to the first system dimension determination method has a problem in that a system dimension is determined depending on determination of the operator, an optimum system dimension may not be determined at all times, or trial and error is required to determine the system dimension.

In addition, the second system dimension determination method is applied in Patent Literature 1 as a method for coping with the above-mentioned problem. However, in this method, a determined system dimension changes depending on schemes of assigning an evaluation function, and thus a system dimension is determined depending on the schemes of assigning the evaluation function. Therefore, in this method, an optimum system dimension may not be determined at all times, or trial and error is required to determine the system dimension. As such, this method fails to solve the above-mentioned problem.

The invention has been conceived in view of the above description. An object of the invention is to obtain a system identification device capable of eliminating trial and error from determination of a system dimension, determining an optimum system dimension at all times, and identifying a linear discrete-time system that delineates a dynamic system even when a singular value of a block Hankel matrix calculated from an actual impulse response gradually and monotonously decreases, and a boundary between a singular value having a significant value and a singular value corresponding to a minute value that can be ignored is unclear.

Solution to Problem

According to an aspect of the present invention in order to solve the problems and achieve the object, there is provided a system identification device receiving an impulse response of a dynamic system to be identified and a designated search range of a system dimension, the system identification device including: a direct feedthrough term identification unit that identifies and outputs a direct feedthrough term of a linear discrete-time system delineating the dynamic system from the impulse response; a block Hankel matrix generator that generates and outputs a block Hankel matrix from the impulse response; a singular value decomposition unit that outputs a first orthogonal matrix, a column vector of which corresponds to a left singular vector of the block Hankel matrix, a second orthogonal matrix, a column vector of which corresponds to a right singular vector of the block Hankel matrix, and a singular value of the block Hankel matrix through singular value decomposition of the block Hankel matrix output from the block Hankel matrix generator; a system dimension determination unit that identifies a system matrix excluding the direct feedthrough term in system matrices of the linear discrete-time system with respect to each dimension belonging to the search range based on the first orthogonal matrix, the second orthogonal matrix, the singular value, and the search range, and determines and outputs a system dimension from a comparison of a system characteristic of the linear discrete-time system calculated based on the system matrix and the direct feedthrough term and an actual system characteristic of the dynamic system; and a system matrix identification unit that identifies a system matrix excluding the direct feedthrough term in system matrices of the linear discrete-time system based on the first orthogonal matrix, the second orthogonal matrix, the singular value, and the system dimension output from the system dimension determination unit, wherein the direct feedthrough term identified by the direct feedthrough term identification unit and the system matrix identified by the system matrix identification unit are output as the linear discrete-time system.

Advantageous Effects of Invention

According to the invention, with regard to a dynamic system to be identified, there are effects in that trial and error may be eliminated from determination of a system dimension, an optimum system dimension may be determined at all times, and a linear discrete-time system that delineates the dynamic system may be identified even when a singular value of a block Hankel matrix calculated from an actual impulse response gradually and monotonously decreases, and a boundary between a singular value having a significant value and a singular value corresponding to a minute value that can be ignored is unclear.

DESCRIPTION OF EMBODIMENTS

Hereinafter, embodiments of a system identification device according to the invention will be described in detail with reference to drawings. It should be noted that the invention is not restricted by the embodiments.

First Embodiment

Figure 1:
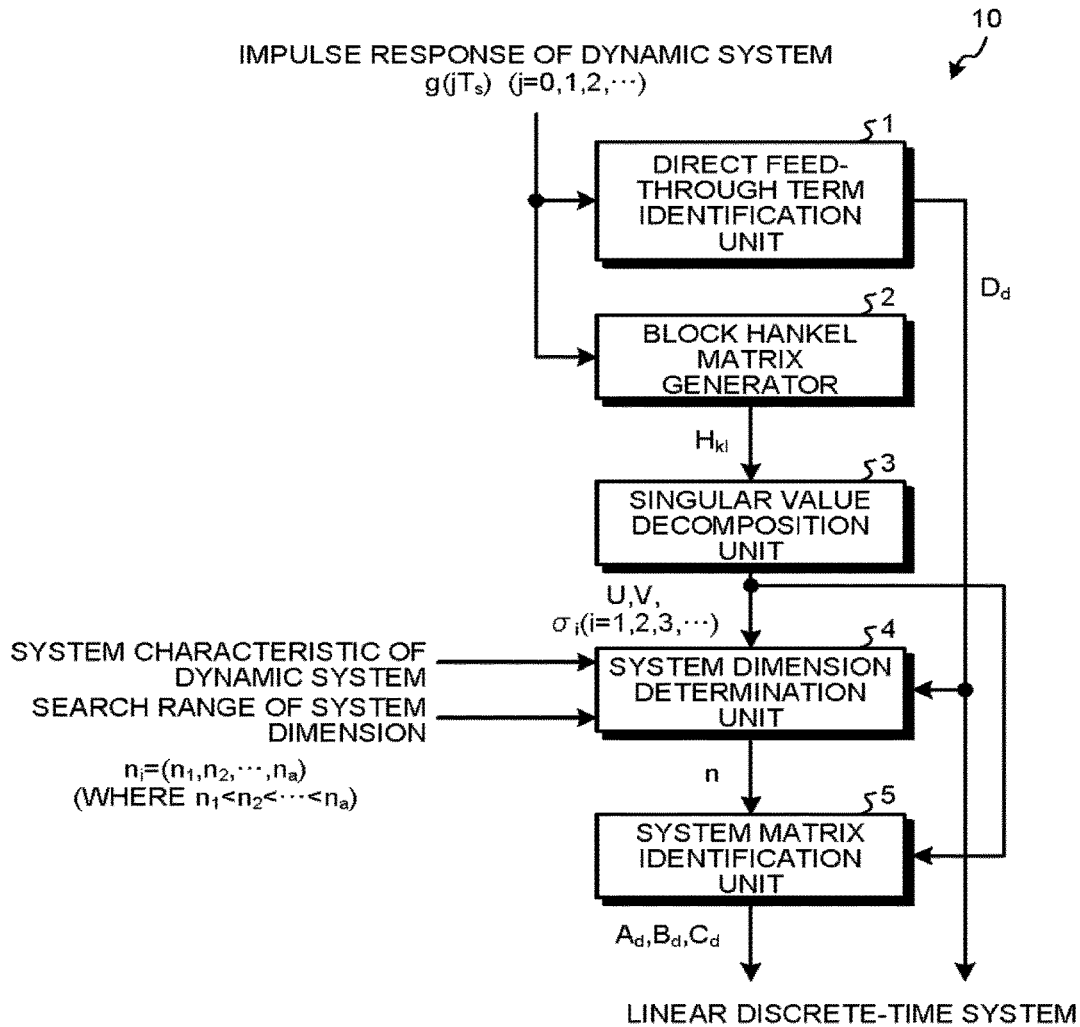
FIG. 1 is a block diagram illustrating a whole configuration of a system identification device according to a first embodiment.
Figure 2:
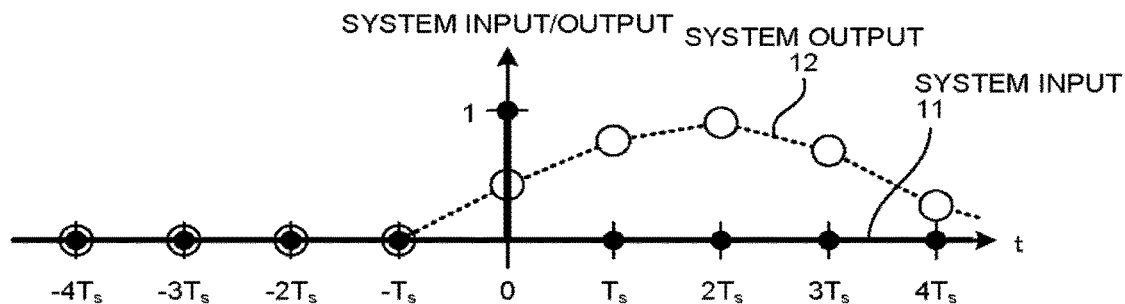
FIG. 2 is a schematic diagram illustrating a time waveform of a system input/output in the system identification device according to the first embodiment.

FIG. 1 is a block diagram illustrating a whole configuration of a first embodiment of a system identification device according to the invention. FIG. 2 is a schematic diagram illustrating a time waveform of a system input/output in the system identification device according to the present embodiment. In the system identification device 10 illustrated in FIG. 1, an impulse response $g(jT_s)$ (j=0, 1, 2, ...) of a dynamic system to be identified is set as an input. As illustrated in FIG. 2, the impulse response $g(jT_s)$ (j=0, 1, 2, ...) is given by a system output 12 after t=0 when a system input 11 to the dynamic system is configured by an ideal impulse input, an amplitude of which becomes 1 at t=0 and becomes 0 at a time other than t=0.

In the system identification device 10, a direct feedthrough term $D_d$ of a linear discrete-time system that delineates the dynamic system is identified by a direct feedthrough term identification unit 1, and a block Hankel matrix $H_{kl}$ is generated by a block Hankel matrix generator 2 based on the obtained impulse response $g(jT_s)$ (j=0, 1, 2, ...) of the dynamic system.

A singular value decomposition unit 3 applies singular value decomposition to the block Hankel matrix $H_{kl}$ which is output from the block Hankel matrix generator 2, and outputs a first orthogonal matrix U, a column vector of which corresponds to a left singular vector of the block Hankel matrix $H_{kl}$, a second orthogonal matrix V, a column vector of which corresponds to a right singular vector of the block Hankel matrix $H_{kl}$, and a singular value $\sigma_i$ (i=1, 2, 3, ...) of the block Hankel matrix $H_{kl}$.

A system dimension determination unit 4 identifies a system matrix excluding the direct feedthrough term $D_d$ of the linear discrete-time system that delineates the dynamic system with respect to each of dimensions $n_i$ (i=1, 2, ..., a) belonging to a search range $n_i=(n_1, n_2, ..., n_a)$ (where $n_1 < n_2 < ... < n_a$) of a system dimension designated by an operator based on the first orthogonal matrix U, the second orthogonal matrix V, and the singular value $\sigma_i$ (i=1, 2, 3, ...) output from the singular value decomposition unit 3, and the search range. Further, the system dimension determination unit 4 calculates an estimated impulse response of the linear discrete-time system with respect to each of the dimensions $n_i$ (i=1, 2, ..., a) belonging to the search range based on the system matrix and the direct feedthrough term $D_d$ output from the direct feedthrough term identification unit 1, and determines a system dimension n from a comparison with an actual impulse response of the dynamic system (a system characteristic of the dynamic system in FIG. 1).

A system matrix identification unit 5 identifies system matrices $A_d$, $B_d$, and $C_d$ excluding the direct feedthrough term $D_d$ of the linear discrete-time system based on the first orthogonal matrix U, the second orthogonal matrix V, and the singular value $\sigma_i$ (i=1, 2, 3, ...) output from the singular value decomposition unit 3, and the system dimension n output from the system dimension determination unit 4.

The system identification device 10 finally outputs the direct feedthrough term $D_d$ identified by the direct feedthrough term identification unit 1 and the system matrices $A_d$, $B_d$, and $C_d$ identified by the system matrix identification unit 5 as the linear discrete-time system that delineates the dynamic system.

Figure 3:
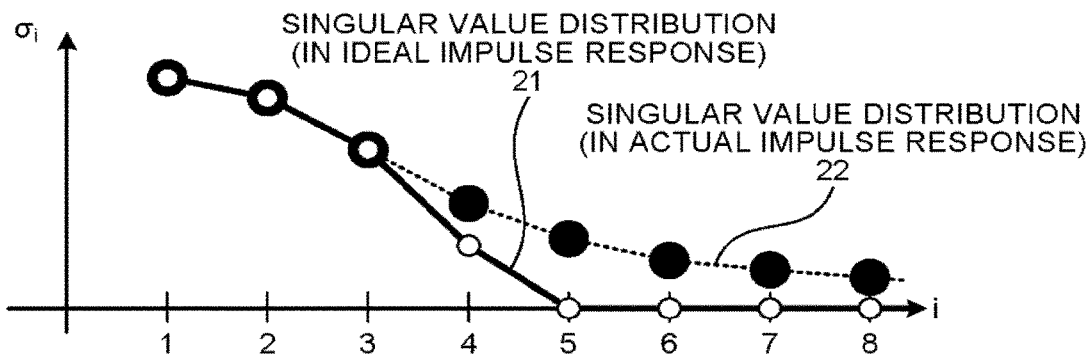
FIG. 3 is a schematic diagram illustrating a relation between a singular value of a block Hankel matrix and a dimension in the system identification device according to the first embodiment.
Figure 4:
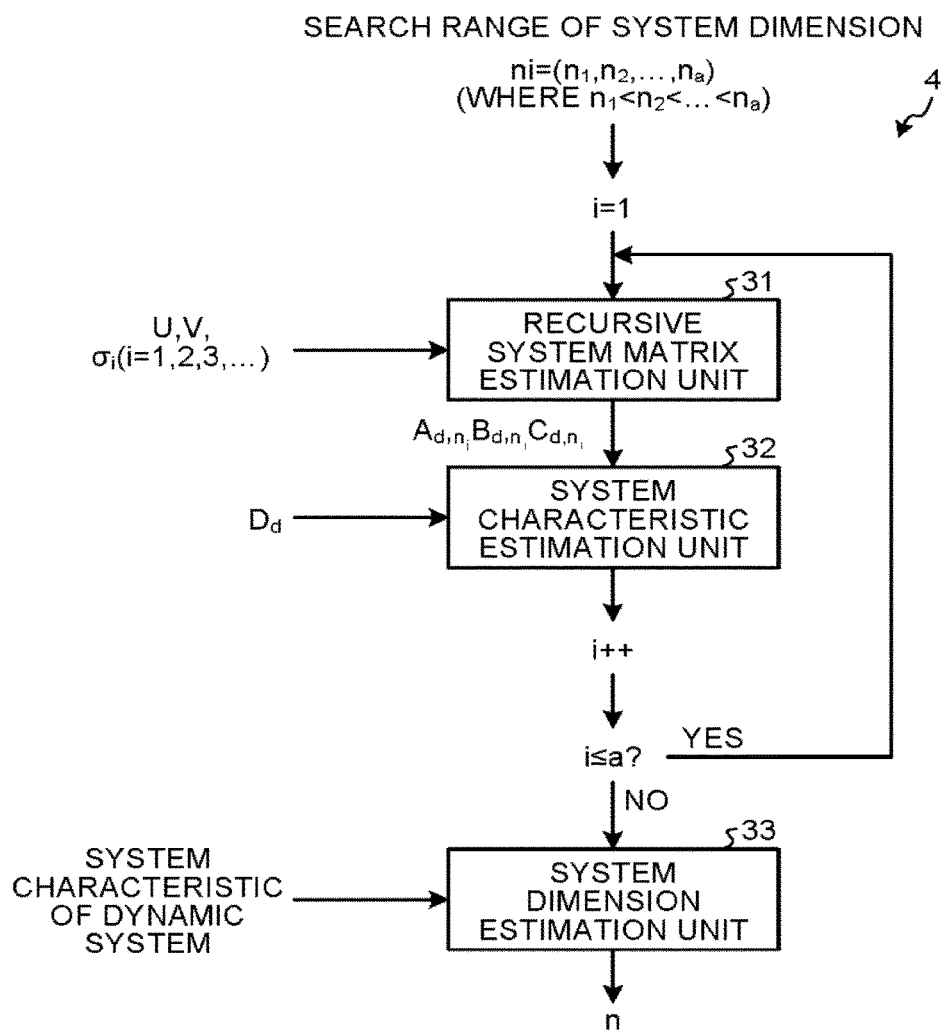
FIG. 4 is a block diagram illustrating an internal configuration and an operation of a system dimension determination unit in the system identification device according to the first embodiment.
Figure 5:
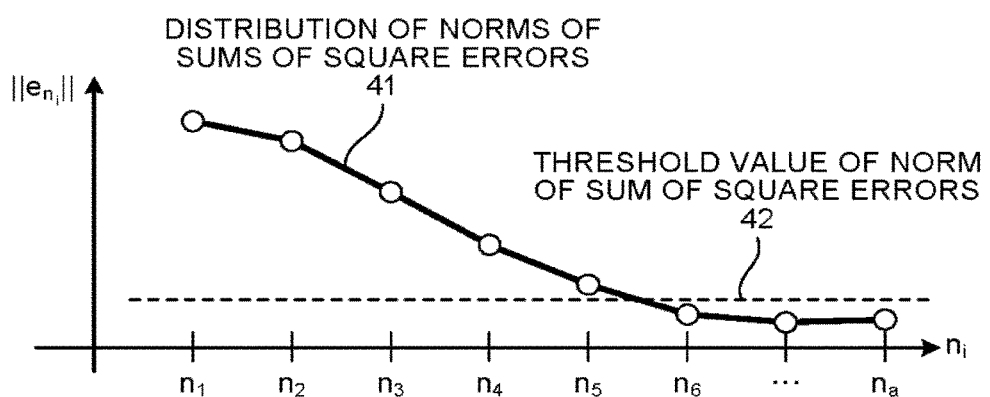
FIG. 5 is a schematic diagram illustrating a relation between a dimension and the norm of the sum of square errors of an estimated impulse response of an identified linear discrete-time system and an actual impulse response of a system in the system identification device according to the first embodiment.

FIG. 3 is a schematic diagram illustrating a relation between the singular value $\sigma_i$ of the block Hankel matrix $H_{kl}$ and a dimension (i=1, 2, 3, . . . ) in the system identification device 10 according to the present embodiment. FIG. 4 is a block diagram illustrating an internal configuration and an operation of the system dimension determination unit 4 in the system identification device 10 according to the present embodiment. FIG. 5 is a schematic diagram illustrating a relation between a dimension $n_i$ (i=1, 2, . . . , a) and the norm of the sum of square errors $\|e_{ni}\|$ in the time domain of the estimated impulse response of the identified linear discrete-time system and the actual impulse response of the dynamic system in the system identification device 10 according to the present embodiment. Referring to FIG. 4, processing of "i=1", processing of "i++", and determination of "i≤a" may be performed by a system characteristic estimation unit 32 or a system dimension estimation unit 33, or may be performed by another configuration which is not illustrated in the figure.

As illustrated in FIG. 3, for example, the singular value $\sigma_i$ of the block Hankel matrix $H_{kl}$ generated from the impulse response $g(jT_s)$ (j=0, 1, 2, . . . ) of the dynamic system has a relation illustrated in a singular value distribution 21 with respect to dimensions (i=1, 2, 3, . . . ) in an ideal impulse response.

In this case, the number of singular values having significant values may be clearly defined, and the number corresponds to a system dimension n of the dynamic system (in FIG. 3, the system dimension n equals 4). On the other hand, for example, a singular value $\sigma_i$ calculated based on an actual impulse response influenced by observation noise, etc. has a relation illustrated in a singular value distribution 22 with respect to dimensions (i=1, 2, 3, . . . ). Thus, there is a problem in that a boundary between a singular value having a significant value and a singular value corresponding to a minute value that can be ignored is unclear, an optimum system dimension n may not be determined at all times, or determination of a system dimension n requires trial and error.

In this regard, as illustrated in FIG. 4, the system dimension determination unit 4 identifies, with respect to a first dimension $n_i$ belonging to the search range $n_i=(n_1, n_2, \ldots, n_a)$ (where $n_1<n_2< \ldots <n_a$) of the system dimension designated by the operator, system matrices $A_{d,ni}$, $B_{d,ni}$, and $C_{d,ni}$ corresponding to the first dimension $n_i$ through a recursive method by a recursive system matrix estimation unit 31 using an identification result of system matrices $A_{d,ni-1}$, $B_{d,ni-1}$, and $C_{d,ni-1}$ corresponding to a second dimension $n_{i-1}$ lower than the first dimension $n_i$ by one level, and a left singular vector $u_j$, a right singular vector $v_j$, and a singular value $\sigma_j$ (j=$n_{i-1}$+1, $n_{i-1}$+2, . . . , $n_i$), each of which corresponds to a dimension greater than the second dimension $n_{i-1}$ and less than or equal to the first dimension $n_i$, in the first orthogonal matrix U, the second orthogonal matrix V, and the singular value $\sigma_i$ (i=1, 2, 3, . . . ) output from the singular value decomposition unit 3.

The system identification device 10 in which the system dimension determination unit 4 includes the recursive system matrix estimation unit 31 may reduce the amount of computation for determining a system dimension having a high conformity degree with respect to an actual dynamic system. Here, the recursive system matrix estimation unit 31 identifies the system matrices $A_{d,ni}$, $B_{d,ni}$, and $C_{d,ni}$ corresponding to the first dimension $n_i$ through the recursive method using the identification result of the system matrices $A_{d,ni-1}$, $B_{d,ni-1}$, and $C_{d,ni-1}$ corresponding to the second dimension $n_{i-1}$ lower than the first dimension $n_i$ by one level in the search range $n_i=(n_1, n_2, \ldots, n_a)$ (where $n_1< n_2< \ldots <n_a$), and the left singular vector $u_j$, the right singular vector $v_j$, and the singular value $\sigma_j$ (j=$n_{i-1}$+1, $n_{i-1}$+2, . . . , $n_i$), each of which corresponds to a dimension greater than the second dimension $n_{i-1}$ and less than or equal to the first dimension $n_i$, from the first orthogonal matrix U, the second orthogonal matrix V, and the singular value $\sigma_i$ (i=1, 2, 3, . . . ).

Subsequently, the system characteristic estimation unit 32 calculates the estimated impulse response of the identified linear discrete-time system based on the system matrices $A_{d,ni}$, $B_{d,ni}$, and $C_{d,ni}$ output from the recursive system matrix estimation unit 31 and the direct feedthrough term $D_d$ output from the direct feedthrough term identification unit 1 with respect to each dimension belonging to the search range $n_i=(n_1, n_2, \ldots, n_a)$ (where $n_1<n_2< \ldots <n_a$) of the system dimension. Further, i is incremented by 1. The system matrices $A_{d,ni}$, $B_{d,ni}$, and $C_{d,ni}$ are identified by the recursive system matrix estimation unit 31 when i≤a, and the operation proceeds to processing of the system dimension estimation unit 33 when i>a.

The system dimension estimation unit 33 calculates the sum of square errors $e_{ni}$ (i=1, 2, . . . , a) in the time domain of the estimated impulse response of the linear discrete-time system output from the system characteristic estimation unit 32 and the actual impulse response of the dynamic system (system characteristic of the dynamic system in FIG. 4), determines a minimum dimension among dimensions at which a distribution 41 of the norms of the sums of square errors is less than or equal to a threshold value 42 of the norm of the sum of square errors as illustrated in FIG. 5 to be the system dimension n, and outputs the system dimension n (in the case of FIG. 5, the system dimension n=$n_6$).

That is, the system identification device 10, in which the system dimension determination unit 4 includes the system characteristic estimation unit 32 and the system dimension estimation unit 33, may eliminate trial and error from determination of a system dimension, determine a system dimension having a high conformity degree in the time domain with respect to the actual dynamic system, and identify a linear discrete-time system that delineates the dynamic system even when a singular value of a block Hankel matrix calculated from an actual impulse response gradually and monotonously decreases, and a boundary between a singular value having a significant value and a singular value corresponding to a minute value that can be ignored is unclear. Here, the system characteristic estimation unit 32 calculates and outputs a system characteristic of the linear discrete-time system as the estimated impulse response with respect to each dimension belonging to the search range $n_i=(n_1, n_2, \ldots, n_a)$, and the system dimension estimation unit 33 determines a minimum dimension among dimensions, at which the norm of the sum of square errors in the time domain of the estimated impulse response of the linear discrete-time system output from the system characteristic estimation unit 32 and the actual impulse response of the dynamic system is less than or equal to the threshold value, to be the system dimension, and outputs the dimension.

Next, an operation will be described. It is presumed that the dynamic system to be identified can be delineated by a 1-input and P-output n-dimensional linear discrete-time system shown in Equation (1) below. When a system input $u(jT_s)$ to the above-described dynamic system is configured by a system input 11 illustrated in FIG. 2, that is, Equation (2) below to obtain an ideal impulse input, a system output $y(jT_s)$ corresponding to Equation (1), that is, a system output 12 illustrated in FIG. 2 becomes Equation (3) below, and the impulse response $g(jT_s)$ $(j=0, 1, 2, \ldots)$ of the dynamic system is given by the system output 12 after $t=0$.

[Equation 1]

$$x((j+1)T_s) = A_d x(jT_s) + B_d u(jT_s)$$

$$y(jT_s) = C_d x(jT_s) + D_d u(jT_s) \quad (1)$$

Here, a state vector $x \in R^n$, a system input $u \in R$, a system output $y \in R^P$, system matrices $A_d \in R^{n \times n}$, $B_d \in R^n$, $C_d \in R^{P \times n}$, and $D_d \in R^P$, and an impulse response column $g(jT_s)$ $(j=0, 1, 2, \ldots)$.

[Equation 2]

$$u(jT_s) = \begin{cases} 1 & (j=0) \\ 0 & (j \neq 0) \end{cases} \quad (2)$$

[Equation 3]

$$\begin{cases} y(0) = g(0) = D_d \\ y(T_s) = g(T_s) = C_d B_d \\ y(2T_s) = g(2T_s) = C_d A_d B_d \\ y(3T_s) = g(3T_s) = C_d A_d^2 B_d \\ \vdots \end{cases} \quad (3)$$

As illustrated in FIG. 1, the system identification device 10 according to the present embodiment sets the impulse response $g(jT_s)$ $(j=0, 1, 2, \ldots)$ of the dynamic system obtained above as an input, identifies the direct feedthrough term $D_d$ of the linear discrete-time system that delineates the dynamic system by the above Equation (1) in the direct feedthrough term identification unit 1 using Equation (4) below, and generates a block Hankel matrix $H_{kl}$ given by Equation (5) below using the block Hankel matrix generator 2.

[Equation 4]

$$D_d = g(0) \quad (4)$$

[Equation 5]

$$H_{k1} = \begin{bmatrix} g(T_s) & g(2T_s) & \cdots & g(1T_s) \\ g(2T_s) & g(3T_s) & \cdots & g((1+1)T_s) \\ \vdots & \vdots & \ddots & \vdots \\ g(kT_s) & g((k+1)T_s) & \cdots & g((k+1-1)T_s) \end{bmatrix} \quad (5)$$

$$= \begin{bmatrix} y(T_s) & y(2T_s) & \cdots & y(1T_s) \\ y(2T_s) & y(3T_s) & \cdots & y((1+1)T_s) \\ \vdots & \vdots & \ddots & \vdots \\ y(kT_s) & y((k+1)T_s) & \cdots & y((k+1-1)T_s) \end{bmatrix} \in R^{kP \times 1}$$

Subsequently, the system identification device 10 applies singular value decomposition to the block Hankel matrix $H_{kl}$, which is output from the block Hankel matrix generator 2, by the singular value decomposition unit 3, and outputs the first orthogonal matrix U, the column vector of which corresponds to the left singular vector $u_j$ of the block Hankel matrix $H_{kl}$ given by Equation (6) below, the second orthogonal matrix V, the column vector of which corresponds to the right singular vector $v_j$ of the block Hankel matrix $H_{kl}$, and the singular value $\sigma_i$ ($i=1, 2, 3, \ldots$) of the block Hankel matrix $H_{kl}$.

[Equation 6]

$$H_{kl} = U \Sigma V^T \quad (6)$$

Here, the first orthogonal matrix $U = [u_1 \; u_2 \; \ldots \; u_{kP}] \in R^{kP \times kP}$, the second orthogonal matrix $V = [v_1 \; v_2 \; \ldots \; u_1] \in R^{1 \times 1}$, the singular values of the block Hankel matrix $H_{k1}$ satisfies an inequality $\sigma_1 \geq \sigma_2 \geq \ldots \geq \sigma_n \geq \sigma_{n+1} \geq \sigma_{n+2} \ldots$, and $\Sigma$ is expressed by Equation (7) below.

[Equation 7]

$$\sum = \begin{bmatrix} \sigma_1 & & 0 \\ & \sigma_2 & \\ 0 & & \ddots \end{bmatrix} \in R^{kP \times 1} \quad (7)$$

The system dimension n of the dynamic system to be identified may be determined based on a relation of Inequality (8) below in which n singular values of the block Hankel matrix $H_{kl}$ have significant values, and an (n+1)th or subsequent singular value is sufficiently smaller than the n singular values and is a minute value that can be ignored.

[Inequality 8]

$$\sigma_1 \geq \sigma_2 \geq \ldots \geq \sigma_n \gg \sigma_{n+1} \geq \sigma_{n+2} \geq \ldots \quad (8)$$

As illustrated in FIG. 3, for example, the singular value $\sigma_i$ of the block Hankel matrix $H_{kl}$ generated from the impulse response $g(jT_s)$ ($j=0, 1, 2, \ldots$) of the dynamic system has the relation illustrated in the singular value distribution 21 with respect to dimensions ($i=1, 2, 3, \ldots$) in the ideal impulse response. In this case, it is possible to clearly define the number of singular values having significant values, and determine the system dimension n of the dynamic system from the number (in the case of FIG. 3, the system dimension n=4).

On the other hand, the singular value $\sigma_i$ calculated based on the actual impulse response influenced by observation noise, etc. has the relation illustrated in the singular value distribution 22 with respect to dimensions ($i=1, 2, 3, \ldots$). Thus, a boundary between a singular value having a significant value and a singular value corresponding to a minute value that can be ignored is unclear. Therefore, the convention scheme has a problem in that an optimum system dimension n may not be determined at all times, or determination of the system dimension n requires trial and error. In this regard, the system identification device 10 of the present embodiment determines an optimum system dimension n in the system dimension determination unit 4 on the assumption that the optimum system dimension n is "most suitable for the actual impulse response in the time domain".

As illustrated in FIG. 1, the system dimension determination unit 4 identifies a system matrix excluding the direct feedthrough term $D_d$ of the linear discrete-time system that delineates the dynamic system with respect to each of dimensions $n_i$ ($i=1, 2, \ldots, a$) belonging to a search range $n_i = (n_1, n_2, \ldots, n_a)$ (where $n_1 < n_2 < \ldots < n_a$) of a system dimension designated by the operator based on the first orthogonal matrix U, the second orthogonal matrix V, and the singular value $\sigma_i$ ($i=1, 2, 3, \ldots$) output from the singular value decomposition unit 3, and the search range.

Further, the system dimension determination unit 4 calculates an estimated impulse response of the identified linear discrete-time system with respect to each of the dimensions $n_i$ ($i=1, 2, \ldots, a$) belonging to the search range based on the system matrix and the direct feedthrough term $D_d$ output from the direct feedthrough term identification unit 1, and determines a system dimension n from a comparison with an actual impulse response of the dynamic system (a system characteristic of the dynamic system in FIG. 1). Specifically, as illustrated in FIG. 4, the system dimension determination unit 4 identifies, with respect to a first dimension $n_i$ belonging to the search range $n_i=(n_1, n_2, \ldots, n_a)$ (where $n_1 < n_2 < \ldots < n_a$) of the system dimension designated by the operator, system matrices $A_{d,ni}$, $B_{d,ni}$, and $C_{d,ni}$ corresponding to the first dimension $n_i$ through a recursive method by the recursive system matrix estimation unit 31 using an identification result of system matrices $A_{d,ni-1}$, $B_{d,ni-1}$, and $C_{d,ni-1}$ corresponding to a second dimension $n_{i-1}$ lower than the first dimension $n_i$ by one level, and a left singular vector $u_j$, a right singular vector $v_j$, and a singular value $\sigma_j$ ($j=n_{i-1}+1, n_{i-1}+2, \ldots, n_i$), each of which corresponds to a dimension greater than the second dimension $n_{i-1}$ and less than or equal to the first dimension $n_i$, in the first orthogonal matrix U, the second orthogonal matrix V, and the singular value $\sigma_i$ ($i=1, 2, 3, \ldots$) output from the singular value decomposition unit 3. First, an extended observability matrix corresponding to the first dimension $n_i$ is expressed by Equation (9) below.

[Equation 9]

$$O_{k,n_i} = U_{n_i} \sum_{n_i}^{1/2} \quad (9)$$

$$= [O_{k,n_{i-1}} | \sqrt{\sigma_{n_{i-1}+1}} \, u_{n_{i-1}+1} \cdots \sqrt{\sigma_{n_i}} \, u_{n_i}] \in R^{kP \times n_i}$$

$$= \begin{cases} U(:,1:n_i) \sum (1:n_i, 1:n_i)^{1/2} & (n_i = n_1) \\ [O_{k,n_i} U(:, n_{i-1}+1:n_i) \\ \sum (n_{i-1}+1:n_i, n_{i-1}+1:n_i)^{1/2}] & (n_i > n_1) \end{cases}$$

An extended reachability matrix corresponding to the first dimension $n_i$ is expressed by Equation (10) below.

[Equation 10]

$$C_{1,n_i} = \sum_{n_i}^{1/2} V_{n_i}^T = \begin{bmatrix} C_{1,n_{i-1}} \\ \hline \sqrt{\sigma_{n_{i-1}+1}} V_{n_{i-1}+1}^T \\ \vdots \\ \sqrt{\sigma_{n_i}} V_{n_i}^T \end{bmatrix} \in R^{n_i \times l} \quad (10)$$

$$\begin{cases} \sum (1:n_i, 1:n_i)^{1/2} V(:, 1:n_i)^T & (n_i = n_1) \\ \begin{bmatrix} C_{1,n_{i-1}} \\ \sum (n_{i-1}+1:n_i, n_{i-1}+1:n_i)^{1/2} V(:, n_{i-1}+1:n_i)^T \end{bmatrix} & (n_i > n_1) \end{cases}$$

Therefore, the system matrices $A_{d,ni}$, $B_{d,ni}$, and $C_{d,ni}$ corresponding to the first dimension $n_i$ is expressed by Equation (11) below.

[Equation 11]

$$A_{d,n_i} = O_{k,n_i}(1:(k-1)P,:)^\dagger O_{k,n_i}(P+1:kP,:) \in R^{n_i \times n_i}$$

$$B_{d,n_i} = C_{l,n_i}(:,1) \in R^{n_i}$$

$$C_{d,n_i} = O_{k,n_i}(1:P,:) \in R^{p \times n_i} \quad (11)$$

Subsequently, the system characteristic estimation unit 32 calculates an estimated impulse response $\hat{g}_{n_1}(jT_s)$ ($j=0, 1, 2, \ldots$) of the identified linear discrete-time system by applying the above Equation (2) as the system input $u(jT_s)$ corresponding to the above Equation (1) based on the system matrices $A_{d,ni}$, $B_{d,ni}$, and $C_{d,ni}$ output from the recursive system matrix estimation unit 31 and the direct feedthrough term $D_d$ output from the direct feedthrough term identification unit 1 with respect to each dimension $n_i$ belonging to the search range $n_i=(n_1, n_2, \ldots, n_a)$ (where $n_1<n_2< \ldots <n_a$) of the system dimension.

In this specification, "$\hat{g}$" is an alternative notation of a character created by disposing "^ (circumflex)" above "g".

The system dimension estimation unit 33 calculates the sum of square errors $e_{ni}$ ($i=1, 2, \ldots, a$) in the time domain of the estimated impulse response $\hat{g}_{ni}(jT_s)$ ($j=0, 1, 2, \ldots$) of the linear discrete-time system output from the system characteristic estimation unit 32 and the actual impulse response $g(jT_s)$ ($j=0, 1, 2, \ldots$) of the dynamic system (system characteristic of the dynamic system in FIG. 4) using Equation (12) below.

[Equation 12]

$$e_{n_i} = \sum_{j=0}^{k+1-1} (g(jT_s) - \hat{g}_{n_i}(jT_s))^2 \in R^P \quad (12)$$

A dimension $n_i$ at which the norm of the sum of square errors $\|e_{ni}\|$ is the smallest becomes a system dimension n which is "most suitable for the actual impulse response in the time domain". On the other hand, when observation noise is white noise, an actual norm $\|e_{ni}\|$ does not depend on a noise level thereof, and monotonously decreases as the dimension $n_i$ increases. In addition, the actual norm $\|e_{ni}\|$ becomes nearly constant at a certain dimension ($n_6$ in FIG. 5) or more as illustrated in FIG. 5. Therefore, herein, the threshold value 42 of the norm of the sum of square errors given by Expression (13) is defined to prevent an estimated value of the system dimension n from becoming a dimension higher than necessary. Further, a minimum dimension among dimensions at which the distribution 41 of the norms of the sums of square errors is less than or equal to the threshold value 42 of the norm of the sum of square errors is determined to be the system dimension n, and the system dimension n is output (in the case of FIG. 5, the system dimension n=$n_6$).

[Expression 13]

Allowed value of sum of square errors·min($\|e_{ni}\|$)   (13)

Finally, the system matrix identification unit 5 identifies system matrices $A_d$, $B_d$, and $C_d$ excluding the direct feedthrough term $D_d$ of the linear discrete-time system using Equation (14) below, based on the first orthogonal matrix U, the second orthogonal matrix V, and the singular value $\sigma_i$ ($i=1, 2, 3, \ldots$) output from the singular value decomposition unit 3, and the system dimension n output from the system dimension determination unit 4.

[Equation 14]

$$O_k = U(:,1:n)\Sigma(1:n,1:n)^{1/2} \in R^{kP \times n}$$

$$C_l = \Sigma(1:n,1:n)^{1/2} V(:,1:n)^T \in R^{n \times l}$$

$$A_d = O_k(1:(k-1)P,:)^\dagger O_k(P+1:kP,:) \in R^{n \times n}$$

$$B_d = C_l(:,1) \in R^n$$

$$C_d = O_k(1:P,:) \in R^{p \times n} \quad (14)$$

The system identification device 10 finally outputs the system matrices $A_d$, $B_d$, and $C_d$ identified by the system matrix identification unit 5, and the direct feedthrough term $D_d$ identified by the direct feedthrough term identification unit 1 as the linear discrete-time system that delineates the dynamic system.

In this way, trial and error may be eliminated from determination of a system dimension n, a system dimension n having a high conformity degree in the time domain may be determined with respect to the actual dynamic system, and a linear discrete-time system that delineates the dynamic system may be identified by the system identification device 10 of the present embodiment even when a singular value $\sigma_i$ (i=1, 2, 3, . . . ) of the block Hankel matrix $H_{kl}$ calculated from the actual impulse response gradually and monotonously decreases, and a boundary between a singular value having a significant value and a singular value corresponding to a minute value that can be ignored in identification is unclear.

In addition, the amount of computation for determining a system dimension n having a high conformity degree with respect to the actual dynamic system may be reduced by the recursive system matrix estimation unit 31.

The system identification device 10 of the present embodiment calculates a system characteristic of the linear discrete-time system as an estimated impulse response, and determines a minimum dimension among dimensions, at which the distribution 41 of the norms of the sums of square errors in the time domain of the impulse response and the actual impulse response of the dynamic system is less than or equal to the threshold value 42 of the norm of the sum of square errors, to be the system dimension n. However, the invention is not limited thereto. The system characteristic of the linear discrete-time system may be calculated as an estimated frequency response, and the system dimension n may be determined based on the sum of square errors in the frequency domain of the frequency response and an actual frequency response obtained by Fourier-transforming the impulse response of the dynamic system. In this case, a weight function may be further determined based on the actual frequency response of the dynamic system, and the system dimension n may be determined based on a weighted value corresponding to a value obtained by multiplying the weight function by a square error value in the frequency domain of the estimated frequency response of the linear discrete-time system and the actual frequency response of the dynamic system.

Second Embodiment

In the present embodiment, a description will be given of a system identification device that may allow application of an actual system input/output obtained by impulsive excitation of a dynamic system, and restrictively identify a stable system when it is clear that an actual dynamic system is stable.

A method of striking and vibrating a target dynamic system using an impulse hammer, and measuring a system output at the time of applying the impulsive force is the most general method as a method for obtaining an impulse response of a dynamic system. However, an actual system input obtained by impulsive excitation has a semi-sinusoidal shape, and thus is different from an actual impulse input. Therefore, a system output obtained by the input is different from an actual impulse response of the dynamic system, and thus there is a problem in that the system output cannot be applied to the method of Ho-Kalman without change.

In addition, in a conventional system identification device using an impulse response, a stability of a linear discrete-time system $(A_d, B_d, C_d, D_d)$ obtained as a result of identification is not considered, and thus there is a problem in that the system may be identified as an unstable system even when an actual dynamic system is stable.

In view of the above-mentioned problems, an object of the present embodiment is to obtain a system identification device that may allow application of an actual system input/output obtained by impulsive excitation of a dynamic system, and restrictively identify a stable system when it is clear that an actual dynamic system is stable.

In the present embodiment, a block diagram illustrating a whole configuration of the system identification device is identical to FIG. 1 of the first embodiment, a schematic diagram illustrating a relation between a singular value ai of a block Hankel matrix $H_{kl}$ and a dimension (i=1, 2, 3, . . . ) is identical to FIG. 3 of the first embodiment, and a schematic diagram illustrating a relation between a dimension $n_i$ (i=1, 2, . . . , a) and the norm of the sum of square errors $\|e_{ni}\|$ in the time domain of an estimated system output of an identified linear discrete-time system and an actual system output of the dynamic system is identical to FIG. 5 of the first embodiment.

Figure 6:
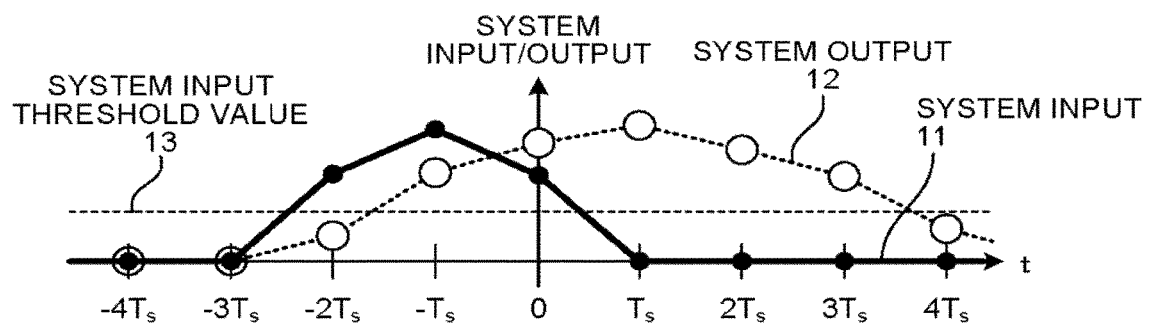
FIG. 6 is a schematic diagram illustrating a time waveform of a system input/output when a dynamic system is stroke and vibrated in a system identification device of a second embodiment.
Figure 7:
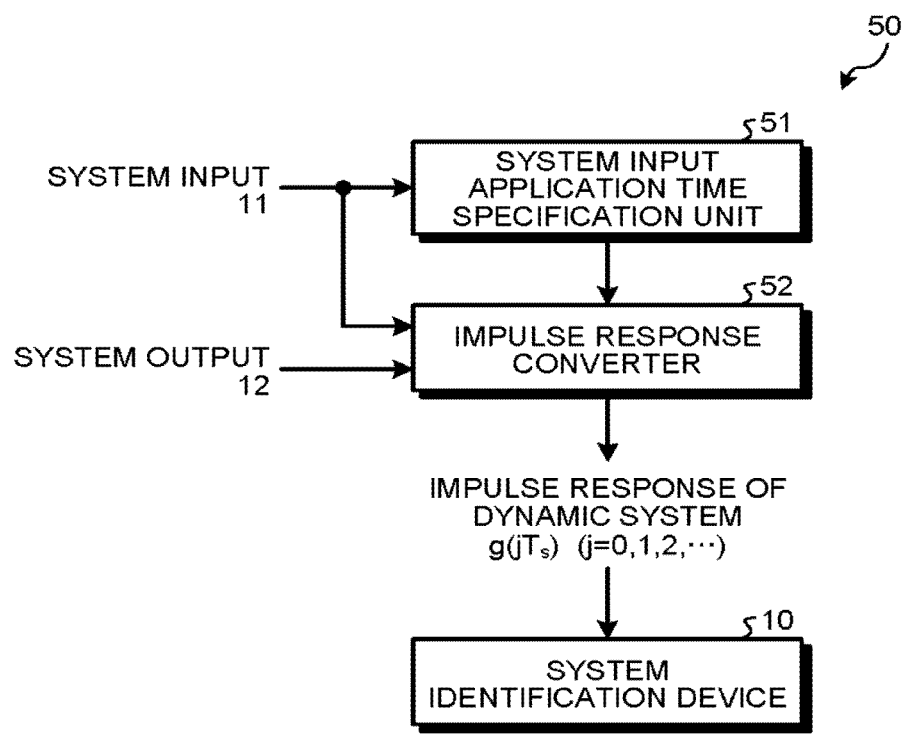
FIG. 7 is a block diagram illustrating a procedure of converting the system input/output obtained when the dynamic system is stroke and vibrated into an impulse response of the system in the system identification device of the second embodiment.

FIG. 6 is a schematic diagram illustrating a time waveform of a system input/output obtained when the dynamic system is stroke and vibrated in the system identification device of the present embodiment. FIG. 7 is a block diagram illustrating a procedure of converting the system input/output obtained when the dynamic system is stroke and vibrated into an impulse response of the system in the system identification device of the present embodiment. In this instance, the impulse response of the dynamic system corresponding to an output of an impulse response converter 52 of FIG. 7 becomes an input of the direct feedthrough term identification unit 1 and the block Hankel matrix generator 2 of FIG. 1. A system input 11 and a system output 12 obtained when the dynamic system to be identified is stroke and vibrated are set as inputs. Further, a system input application time specification unit 51 and the impulse response converter 52 illustrated in FIG. 7 and the whole system identification device 10 of FIG. 1 are collectively set as an impulsive excitation-based system identification device 50.

As illustrated in FIG. 6, the impulsive excitation-based system identification device 50 of the present embodiment identifies a linear discrete-time system that delineates the system based on the system input 11 and the system output 12 obtained when the dynamic system to be identified is stroke and vibrated. Referring to the system input 11 and the system output 12, a plurality of times at which the system input 11 has significant values is specified by the system input application time specification unit 51 as illustrated in FIG. 7. Subsequently, the impulse response converter 52 sets an added value of system inputs corresponding to the plurality of times output from the system input application time specification unit 51 as an impulse input amplitude, and sets a maximum value of the plurality of times output from the system input application time specification unit 51 as an impulse input application time, thereby outputting a signal obtained by dividing a system output obtained after the impulse input application time by the impulse input amplitude as the impulse response of the dynamic system.

Information corresponding to the impulse response is the system input 11 and the system output 12 obtained when the dynamic system is stroke and vibrated. Further, the impulsive excitation-based system identification device 50, which includes the system input application time specification unit 51 and the impulse response converter 52 and identifies the linear discrete-time system using the system input 11 and the system output 12 obtained when the dynamic system to be identified is stroke and vibrated and a search range $n_i=(n_1, n_2, \ldots, n_a)$ (where $n_1<n_2<\ldots<n_a$) as inputs, may identify the linear discrete-time system that delineates the system from an actual system input/output obtained by striking and vibrating the dynamic system. Here, the system input application time specification unit 51 specifies a plurality of times at which the system input 11 has significant values, and the impulse response converter 52 sets an added value of system inputs corresponding to the plurality of times output from the system input application time specification unit 51 as an impulse input amplitude, and sets a maximum value of the plurality of times output from the system input application time specification unit 51 as an impulse input application time, thereby outputting a signal obtained by dividing a system output obtained after the impulse input application time by the impulse input amplitude as the impulse response.

Figure 8:
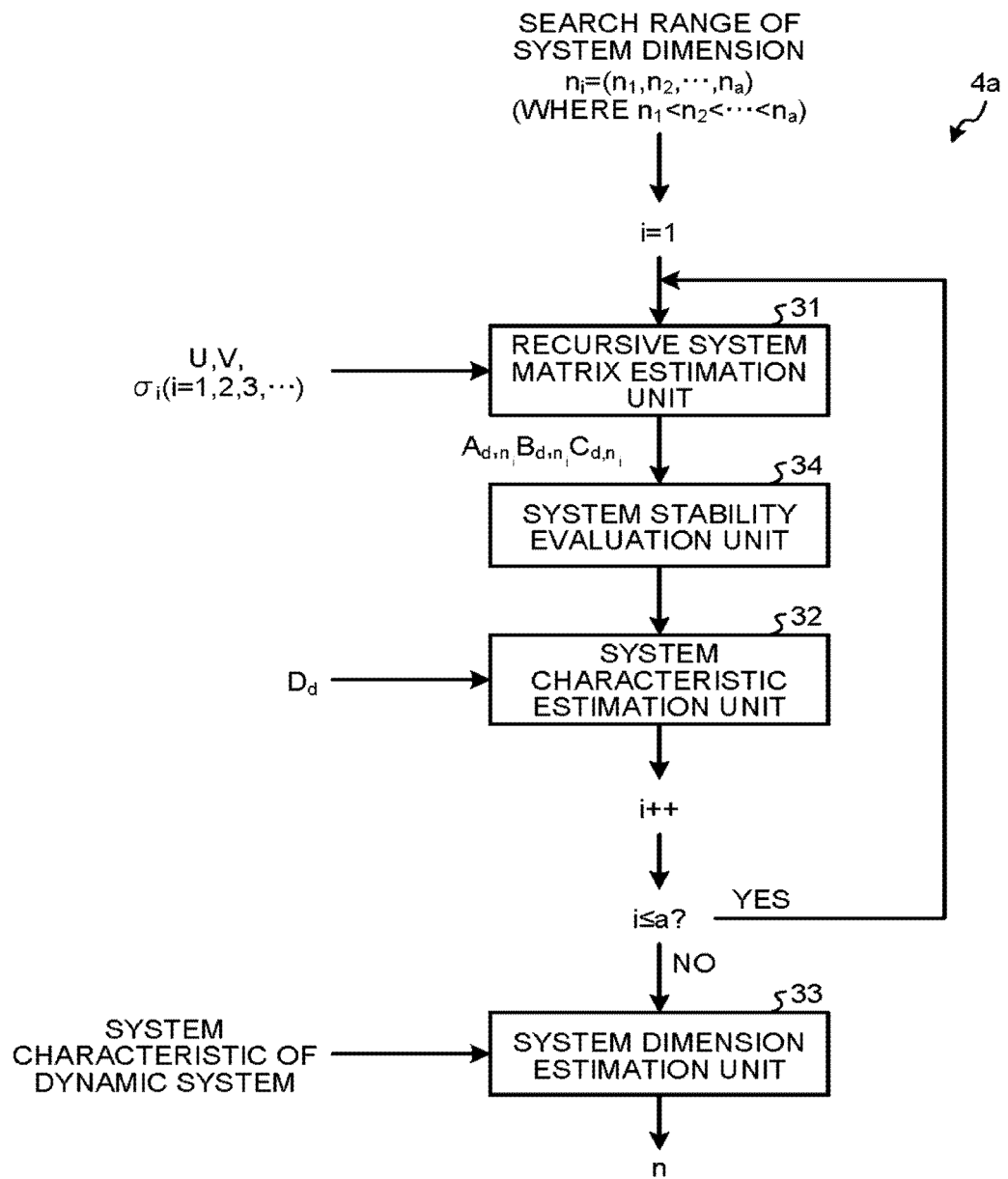
FIG. 8 is a block diagram illustrating an internal configuration and an operation of a system dimension determination unit in the system identification device of the second embodiment.

FIG. 8 is a block diagram illustrating an internal configuration and an operation of a system dimension determination unit 4a in the system identification device of the present embodiment. In FIG. 8, a component corresponding to the same reference numeral as that of FIG. 4 is the same or equivalent component as or to that of the first embodiment. As illustrated in FIG. 8, in the system dimension determination unit 4a of the present embodiment, a system stability evaluation unit 34 evaluates stability of the linear discrete-time system based on a system matrix $A_{d,ni}$ identified by a recursive system matrix estimation unit 31 with respect to each dimension $n_i$ belonging to a search range $n_i=(n_1, n_2, \ldots, n_a)$ (where $n_1<n_2<\ldots<n_a$) of a system dimension designated by an operator. Referring to FIG. 8, processing of "i=1", processing of "i++", and determination of "i≤a" may be performed by a system characteristic estimation unit 32 or a system dimension estimation unit 33, or may be performed by another configuration which is not illustrated in the figure.

The system characteristic estimation unit 32 calculates an estimated system output corresponding to the actual system input 11 with regard to the identified linear discrete-time system based on system matrices $A_{d,ni}$, $B_{d,ni}$, and $C_{d,ni}$ output from the recursive system matrix estimation unit 31 and the direct feedthrough term $D_d$ output from the direct feedthrough term identification unit 1 with respect to a dimension at which the system is determined to be stable by the system stability evaluation unit 34.

In the system identification device 10, the system dimension determination unit 4a includes the system stability evaluation unit 34 that evaluates stability of the linear discrete-time system with respect to each dimension belonging to the search range $n_i=(n_1, n_2, \ldots, n_a)$ (where $n_1<n_2<\ldots<n_a$). Thus, the system identification device 10, which determines a system dimension from a system characteristic of the linear discrete-time system corresponding to a dimension at which the system is stable, may identify the linear discrete-time system that restrictively delineates a stable system when it is clear that an actual dynamic system is the stable system.

The system dimension estimation unit 33 calculates the sum of square errors $e_{ni}$ ($n_i$: dimension at which the system is stable) in the time domain of the estimated system output of the linear discrete-time system output from the system characteristic estimation unit 32 and the actual system output 12 of the dynamic system (system characteristic of the dynamic system in FIG. 8), determines a minimum dimension among dimensions at which the distribution 41 of the norms of the sums of square errors is less than or equal to the threshold value 42 of the norm of the sum of square errors as illustrated in FIG. 5 to be the system dimension n, and outputs the system dimension n (in the case of FIG. 5, the system dimension $n=n_6$)

Next, the operation will be described. It is presumed that the dynamic system to be identified can be expressed as in the above Equation (1) as a 1-input and P-output n-dimensional linear discrete-time system. For example, a system input $u(jT_s)$ obtained when the dynamic system is stroke and vibrated has a time waveform as the system input 11 illustrated in FIG. 6. In this case, the system input $u(jT_s)$ is given by Equation (15) below.

[Equation 15]

$$u(jT_s) = \begin{cases} a_j & (-2 \leq j \leq 0) \\ 0 & (j \leq -2, 0 \leq j) \end{cases} \quad (15)$$

In this instance, a system output $y(jT_s)$ corresponding to the above Equation (1), that is, the system output 12 illustrated in FIG. 6 corresponds to Equation (16) below. Thus, there is difficulty in directly obtaining an impulse response $g(jT_s)$ ($j=0, 1, 2, \ldots$) from the system output $y(jT_s)$.

[Equation 16]

$$\begin{cases} y(0) = g(0)a_0 + g(T_s)a_{-1} + g(2T_s)a_{-2} = \\ \quad D_d a_0 + C_d B_d a_{-1} + C_d A_d B_d a_{-2} \\ y(T_s) = g(T_s)a_0 + g(2T_s)a_{-1} + g(3T_s)a_{-2} = \\ \quad C_d B_d a_0 + C_d A_d B_d a_{-1} + C_d A_d^2 B_d a_{-2} \\ y(2T_s) = g(2T_s)a_0 + g(3T_s)a_{-1} + g(4T_s)a_{-2} = \\ \quad C_d A_d B_d a_0 + C_d A_d^2 B_d a_{-1} + C_d A_d^2 B_d a_{-2} \\ y(3T_s) = g(2T_s)a_0 + g(4T_s)a_{-1} + g(5T_s)a_{-2} = \\ \quad C_d A_d^2 B_d a_0 + C_d A_d^3 B_d a_{-1} + C_d A_d^4 B_d a_{-2} \\ \vdots \end{cases} \quad (16)$$

In this regard, in the impulsive excitation-based system identification device 50 of the present embodiment, the actual system input 11 illustrated in FIG. 6 approximates to the ideal impulse input illustrated in FIG. 2 on the assumption that a vibration time in impulsive excitation is minute. Specifically, the system input application time specification unit 51 illustrated in FIG. 7 sets Expression (17) below obtained by multiplying a maximum value of system inputs $u(jT_s)$ by a ratio threshold value defined by a noise level superimposed on the system inputs $u(jT_s)$ as a system input threshold value 13, and specifies times at which the system inputs $u(jT_s)$ are greater than or equal to the system input threshold value 13 as a plurality of times $j'T_s$ at which the system inputs $u(jT_s)$ have significant values (in the case of FIG. 6, $j'=-2, -1, 0$).

[Expression 17]

System input ratio threshold value·$\max(u(jT_s))$ (17)

In the impulsive excitation-based system identification device 50, the system input application time specification unit 51 sets a value obtained by multiplying a ratio threshold value by a maximum value of a system input as the system input threshold value 13, and specifies times at which the system input is greater than or equal to the system input threshold value 13 as a plurality of times at which the system input has significant values. Thus, the system identification device 50 may accurately extract a vibration time at which the system input has a significant value from the actual system input obtained by impulsive excitation of the dynamic system.

Subsequently, the impulse response converter 52 calculates an added value of system inputs $u(jT_s)$ as an impulse input amplitude $\tilde{a}$ using Equation (18) below with respect to the plurality of times $j'T_s$ output from the system input application time specification unit 51, calculates a maximum value of the plurality of times $j'T_s$ output from the system input application time specification unit 51 as an impulse input application time $j''T_s$ (in the case of FIG. 6, $j''=0$) using Equation (19) below, and calculates the impulse response $g(jT_s)$ ($j=0, 1, 2, \ldots$) of the dynamic system as a signal, which is obtained by dividing the system output $y(jT_s)$ after the impulse input application time $j''T_s$ by the impulse input amplitude $\tilde{a}$ using Equation (20) below.

In this specification, "$\tilde{a}$ " is an alternative notation of a character created by disposing "$\tilde{\phantom{a}}$ (tilde)" above "a".

[Equation 18]

$$\tilde{a} = \sum_{j=j'} u(jT_s) \quad (18)$$

[Equation 19]

$$j''T_s = \max(j'T_s) \quad (19)$$

[Equation 20]

$$g(jT_s) = \frac{1}{\tilde{a}} y((j'' + j)T_s) \ (j = 0, 1, 2, \ldots) \quad (20)$$

In the present embodiment, the impulse response $g(jT_s)$ ($j=0, 1, 2, \ldots$) of the dynamic system obtained by the above Equation (20) is set as an input to the system identification device 10 illustrated in FIG. 1 based on a system input/output obtained when the dynamic system is stroke and vibrated. In the present embodiment, as illustrated in FIG. 1, the system identification device 10 sets the impulse response $g(jT_s)$ ($j=0, 1, 2, \ldots$) of the dynamic system obtained by the above Equation (20) as an input, identifies the direct feedthrough term $D_d$ of the linear discrete-time system of the above Equation (1) which delineates the dynamic system by the direct feedthrough term identification unit 1 using the above Equation (4), and generates a block Hankel matrix $H_{kl}$ given by Equation (21) below by the block Hankel matrix generator 2. Subsequently, the singular value decomposition unit 3 applies singular value decomposition to the block Hankel matrix $H_{kl}$ which is output from the block Hankel matrix generator 2, and outputs the first orthogonal matrix U, the second orthogonal matrix V, and the singular value $\sigma_i$ ($i=1, 2, 3, \ldots$) of the block Hankel matrix $H_{kl}$ given by the above Equation (6).

[Equation 21]

$$\begin{aligned}
H_{k1} &= \begin{bmatrix} g(T_s) & g(2T_s) & \ldots & g(1T_s) \\ g(2T_s) & g(3T_s) & \ldots & g((1+1)T_s) \\ \vdots & \vdots & \ddots & \vdots \\ g(kT_s) & g((k+1)T_s) & \ldots & g((k+1-1)T_s) \end{bmatrix} \\
&= \frac{1}{\tilde{a}} \begin{bmatrix} y((j''+1)T_s) & y((j''+2)T_s) & \ldots & y((j''+1)T_s) \\ y((j''+2)T_s) & y((j''+3)T_s) & \ldots & y((j''+1+1)T_s) \\ \vdots & \vdots & \ddots & \vdots \\ y((j''+k)T_s) & y((j''+k+1)T_s) & \ldots & y((j''+k+1-1)T_s) \end{bmatrix} \\
&\in R^{kP \times 1}
\end{aligned} \quad (21)$$

As illustrated in FIG. 8, the system dimension determination unit 4a identifies, by the recursive system matrix estimation unit 31, corresponding system matrices $A_{d,ni}$, $B_{d,ni}$, and $C_{d,ni}$ through a recursive method shown in the above Equations (9) to (11) with respect to each dimension $n_i$ belonging to a search range $n_i=(n_1, n_2, \ldots, n_a)$ (where $n_1<n_2<\ldots<n_a$) of a system dimension designated by the operator.

The system stability evaluation unit 34 evaluates stability of the linear discrete-time system using Condition (22) below based on the system matrix $A_{d,ni}$ identified by the recursive system matrix estimation unit 31 with respect to each dimension $n_i$ belonging to the search range $n_i=(n_1, n_2, \ldots, n_a)$ (where $n_1<n_2<\ldots<n_a$) of the system dimension designated by the operator.

[Condition 22]

Linear discrete-time system of dimension $ni$ is stable $\Leftrightarrow$ Absolute values of all eigenvalues of system matrix $Ad,ni$ are less than 1 $\Leftrightarrow$ All eigenvalues of system matrix $Ad,ni$ are present within unit circle (22)

Subsequently, the system characteristic estimation unit 32 calculates an estimated system output $\hat{y}_{ni}(jT_s)$ obtained when the actual system input $u(jT_s)$ (for example, Equation (15)) is applied to the above Equation (1) based on the system matrices $A_{d,ni}$, $B_{d,ni}$, and $C_{d,ni}$ output from the recursive system matrix estimation unit 31 and the direct feedthrough term $D_d$ output from the direct feedthrough term identification unit 1 with respect to a dimension at which the system is determined to be stable by the system stability evaluation unit 34.

In this specification, "$\hat{y}$" is an alternative notation of a character created by disposing "$\hat{\phantom{a}}$ (circumflex)" above "y".

The system dimension estimation unit 33 calculates the sum of square errors $e_{ni}$ ($n_i$: dimension at which the system is stable) in the time domain of the estimated system output $\hat{y}_{ni}(jT_s)$ of the linear discrete-time system output from the system characteristic estimation unit 32 and an actual system output $y(jT_s)$ of the dynamic system (system characteristic of the dynamic system in FIG. 8) using Equation (23) below.

[Equation 23]

$$e_{n_i} = \sum_{j=\min(j')}^{\min(j')+k+1-1} (y(jT_s) - \hat{y}_{n_i}(jT_s))^2 \in R^P \quad (23)$$

A dimension $n_i$ at which the norm of the sum of square errors $\|e_{ni}\|$ is the smallest becomes a stable system dimension n which is "most suitable for an actual system output in the time domain". Here, a minimum dimension among dimensions at which the distribution 41 of the norms of the sums of square errors is less than or equal to the threshold value 42 of the norm of the sum of square errors given by the above Expression (13) as illustrated in FIG. 5 is determined to be the system dimension n and is output (in the case of FIG. 5, the system dimension n=$n_6$).

Finally, the system matrix identification unit 5 identifies the system matrices $A_d$, $B_d$, and $C_d$ excluding the direct feedthrough term $D_d$ of the linear discrete-time system using the above Equation (14) based on the first orthogonal matrix U, the second orthogonal matrix V, and the singular value $\sigma_i$ (i=1, 2, 3, . . . ) output from the singular value decomposition unit 3, and the system dimension n output from the system dimension determination unit 4a, and outputs the direct feedthrough term $D_d$ identified by the direct feedthrough term identification unit 1 and the system matrices $A_d$, $B_d$, and $C_d$ identified by the system matrix identification unit 5 as the linear discrete-time system that delineates the dynamic system.

In this way, the impulsive excitation-based system identification device 50 of the present embodiment may convert an actual system input/output into an impulse response, and may eliminate trial and error from determination of a system dimension n, determine a system dimension n having a high conformity degree in the time domain with respect to the actual dynamic system, and identify the linear discrete-time system that delineates the dynamic system even when the singular value $\sigma_i$ (i=1, 2, 3, . . . ) of the block Hankel matrix $H_{kl}$ calculated from the impulse response gradually and monotonously decreases, and a boundary between a singular value having a significant value and a singular value corresponding to a minute value that can be ignored in identification is unclear.

In addition, the recursive system matrix estimation unit 31 may reduce the amount of computation for determining a system dimension n having a conformity degree with respect to the actual dynamic system.

Further, when a vibration time at which a system input has a significant value is accurately extracted from an actual system input/output obtained by impulsive excitation of a dynamic system, and the system input/output is converted into an impulse response of the dynamic system based on the vibration time, a linear discrete-time system that delineates the system may be accurately identified from the actual system input/output obtained by impulsive excitation of the dynamic system.

In addition, when it is clear that an actual dynamic system is a stable system, a linear discrete-time system restricted to a stable system may be identified by the system stability evaluation unit 34.

The impulsive excitation-based system identification device 50 of the present embodiment calculates a system characteristic of the linear discrete-time system as an estimated system output, and determines a minimum dimension among dimensions, at which the distribution 41 of the norms of the sums of square errors in the time domain of the system output and the actual system output of the dynamic system is less than or equal to the threshold value 42 of the norm of the sum of square errors, to be a system dimension n. However, the invention is not limited thereto. A system characteristic of a linear discrete-time system may be calculated as an estimated frequency response, and a system dimension n may be determined based on the sum of square errors in the frequency domain of the frequency response and an actual frequency response obtained by Fourier-transforming an impulse response, which is obtained by converting a system input/output of the dynamic system.

In this case, a weight function may be further determined based on the actual frequency response of the dynamic system, and the system dimension n may be determined based on a weighted value corresponding to a value obtained by multiplying the weight function by a square error value in the frequency domain of the estimated frequency response of the linear discrete-time system and the actual frequency response of the dynamic system.

According to the present embodiment, it is possible to obtain a system identification device that may allow application of an actual system input/output obtained by impulsive excitation of a dynamic system, and restrictively identify a stable system when it is clear that an actual dynamic system is stable.

Third Embodiment

In the present embodiment, a description will be given of a case in which information corresponding to an impulse response is a frequency response of a dynamic system. In the present embodiment, a block diagram illustrating a whole configuration of the system identification device is identical to FIG. 1 of the first embodiment, a schematic diagram illustrating a relation between a singular value $\sigma_i$ of a block Hankel matrix $H_{kl}$ and a dimension (i=1, 2, 3, . . . ) is identical to FIG. 3 of the first embodiment, and a schematic diagram illustrating a relation between a dimension $n_i$ (i=1, 2, . . . , a) and the norm of the sum of square errors $\|e_{ni}\|$ in the time domain of an estimated frequency response of an identified linear discrete-time system and an actual frequency response of the dynamic system is identical to FIG. 5 of the first embodiment. In addition, in the present embodiment, a system dimension determination unit is identical to the system dimension determination unit 4a illustrated in FIG. 8 of the second embodiment.

Figure 9:
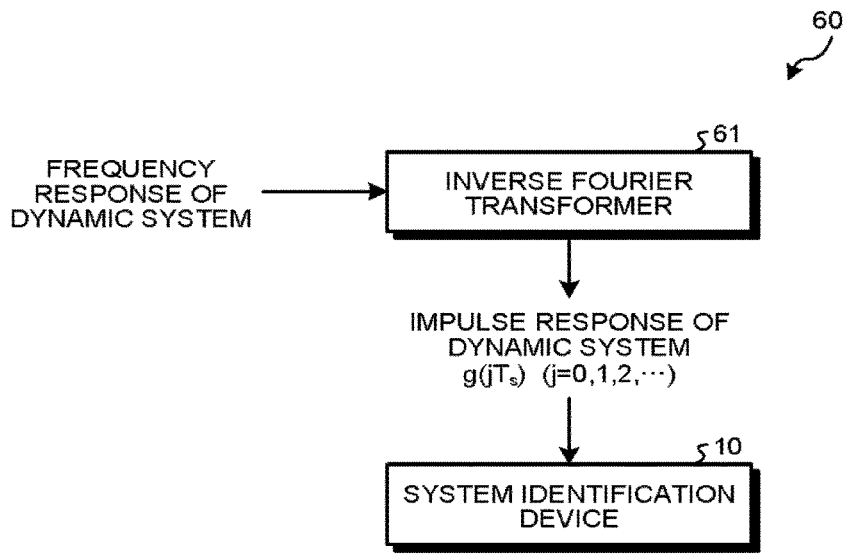
FIG. 9 is a block diagram illustrating a procedure of converting a frequency response of a dynamic system into an impulse response of the system in a system identification device of a third embodiment.

FIG. 9 is a block diagram illustrating a procedure of converting a frequency response of a dynamic system into an impulse response of the system in the system identification device of the present embodiment. In this instance, the impulse response of the dynamic system corresponding to an output of an inverse Fourier transformer 61 of FIG. 9 becomes an input of the direct feedthrough term identification unit 1 and the block Hankel matrix generator 2 of FIG. 1. The frequency response of the dynamic system is set as an input, and a system identification device including the inverse Fourier transformer 61 of FIG. 9 and the system identification device 10 of FIG. 1 is configured as a frequency response-based system identification device 60. The frequency response-based system identification device 60 of the present embodiment identifies a linear discrete-time system that delineates a dynamic system to be identified based on a frequency response of the dynamic system. As illustrated in FIG. 9, the frequency response of the dynamic system is inverse Fourier-transformed by the inverse Fourier transformer 61, and output as the impulse response of the dynamic system.

Information corresponding to the impulse response is the frequency response of the dynamic system. In addition, the frequency response-based system identification device 60, which includes the inverse Fourier transformer 61 that outputs a corresponding impulse response by inverse Fourier transform of the frequency response, and identifies a linear discrete-time system by setting a frequency response of a dynamic system to be identified and a search range $n_i=(n_1, n_2, \ldots, n_a)$ (where $n_1<n_2<\ldots<n_a$) as an input, may identify the linear discrete-time system that delineates the system from the frequency response of the dynamic system.

Next, an operation will be described. It is presumed that the dynamic system to be identified can be delineated as a 1-input and P-output n-dimensional linear discrete-time system using the above Equation (1). When a (complex) frequency response H(kΔf) (k=0, 1, 2, . . . , N−1) of the dynamic system is given, the frequency response is inverse Fourier-transformed by the inverse Fourier transformer 61 illustrated in FIG. 9 using Equation (24) below to obtain an impulse response g(jT$_s$) (j=0, 1, 2, . . . ) of the dynamic system.

[Equation 24]

$$g(jT_s) = \frac{1}{N} \sum_{k=0}^{N-1} H(k\Delta f) \exp\left[i \cdot 2\pi \frac{jk}{N}\right] \quad (24)$$

$$(j = 0, 1, 2, \ldots, N-1)$$

Here, a sampling period $T_s$=T/N, a sampling frequency fs=1/$T_s$=N/T, a frequency resolution Δf=1/T, a time t=jT$_s$=jT/N, and a frequency f=kΔf=k/T.

In the present embodiment, the impulse response g(jT$_s$) (j=0, 1, 2, . . . ) of the dynamic system obtained using the above Equation (24) based on the frequency response H(kΔf) (k=0, 1, 2, . . . , N−1) of the dynamic system is set as an input to the system identification device 10. In the present embodiment, as illustrated in FIG. 1, in the system identification device 10, the impulse response g(jT$_s$) (j=0, 1, 2, . . . ) of the dynamic system obtained using the above Equation (24) is set as an input, the direct feedthrough term D$_d$ of the linear discrete-time system of the above Equation (1) which delineates the dynamic system is identified by the direct feedthrough term identification unit 1 using Equation (4), and a block Hankel matrix H$_{kl}$ given by Equation (25) below is generated by the block Hankel matrix generator 2.

[Equation 25]

$$H_{k1} = \begin{bmatrix} g(T_s) & g(2T_s) & \ldots & g(1T_s) \\ g(2T_s) & g(3T_s) & \ldots & g((1+1)T_s) \\ \vdots & \vdots & \ddots & \vdots \\ g(kT_s) & g((k+1)T_s) & \ldots & g((k+1-1)T_s) \end{bmatrix} \in R^{kP \times 1} \quad (25)$$

Subsequently, singular value decomposition is applied to the block Hankel matrix H$_{kl}$, which is output from the block Hankel matrix generator 2, by the singular value decomposition unit 3 to output the first orthogonal matrix U, the second orthogonal matrix V, and the singular value σ$_i$ (i=1, 2, 3, . . . ) of the block Hankel matrix H$_{kl}$ given by the above Equation (6).

As illustrated in FIG. 8, the system dimension determination unit 4a identifies, by the recursive system matrix estimation unit 31, corresponding system matrices A$_{d,ni}$, B$_{d,ni}$, and C$_{d,ni}$ through a recursive method shown in the above Equations (9) to (11) with respect to each dimension n$_i$ belonging to a search range n$_i$=(n$_1$, n$_2$, . . . , n$_a$) (where n$_1$<n$_2$< . . . <n$_a$) of a system dimension designated by the operator.

The system stability evaluation unit 34 evaluates stability of the linear discrete-time system using the above Condition (22) based on the system matrix A$_{d,ni}$ identified by the recursive system matrix estimation unit 31 with respect to each dimension n$_i$ belonging to the search range n$_i$=(n$_1$, n$_2$, . . . , n$_a$) (where n$_1$<n$_2$< . . . <n$_a$) of the system dimension designated by the operator.

Subsequently, the system characteristic estimation unit 32 calculates an estimated frequency response H^$_{ni}$(kΔf) (k=0, 1, 2, . . . , N−1) of the linear discrete-time system based on the system matrices A$_{d,ni}$, B$_{d,ni}$, and C$_{d,ni}$ output from the recursive system matrix estimation unit 31 and the direct feedthrough term D$_d$ output from the direct feedthrough term identification unit 1 with respect to a dimension at which the system is determined to be stable by the system stability evaluation unit 34.

In this specification, "H^$_{ni}$" is an alternative notation of a character created by disposing "(circumflex)" above "H$_{ni}$".

In the frequency response-based system identification device 60 of the present embodiment, an optimum system dimension n is determined by the system dimension estimation unit 33 on the assumption that the optimum system dimension n is "most suitable for the actual frequency response in the frequency domain". Specifically, for example, a weight function W(kΔf) (k=0, 1, 2, . . . , N−1) shown in Equation (26) below obtained by assigning a weight to a high gain and a low-frequency region is determined based on an actual frequency response H(kΔf) (k=0, 1, 2, . . . , N−1) of the dynamic system, and a weighted value e$_{ni}$ (n$_i$: dimension at which the system is stable) corresponding to a value obtained by multiplying the weight function W(kΔf) by a square error value in the frequency domain of the estimated frequency response H^$_{ni}$ (kΔf) of the linear discrete-time system output from the system characteristic estimation unit 32 and an actual frequency response H(kΔf) of the dynamic system (system characteristic of the dynamic system in FIG. 8) is calculated using Equation (27) below.

[Equation 26]

$$W(k\Delta f) = \frac{|H(k\Delta f)|}{k\Delta f} \quad (k = 0, 1, 2, \ldots, N-1) \quad (26)$$

[Equation 27]

$$e_{n_i} = \sum_{k=0}^{N-1} \left(H(k\Delta f) - \hat{H}_{n_i}(k\Delta f)\right)^2 \cdot W(k\Delta f) \quad (27)$$

A dimension n$_1$ at which the norm of the weighted sum of square errors ‖e$_{ni}$‖ is the smallest becomes a stable system dimension n which is "most suitable for an actual frequency response in the frequency domain according to the weight function". Here, a minimum dimension among dimensions at which the distribution 41 of the norms of the sums of square errors is less than or equal to the threshold value 42 of the norm of the sum of square errors given by the above Expression (13) as illustrated in FIG. 5 is determined to be the system dimension n and output (in the case of FIG. 5, the system dimension n=n$_6$).

Finally, the system matrix identification unit 5 identifies the system matrices A$_d$, B$_d$, and C$_d$ excluding the direct feedthrough term D$_d$ of the linear discrete-time system using the above Equation (14) based on the first orthogonal matrix U, the second orthogonal matrix V, and the singular value σ$_i$ (i=1, 2, 3, . . . ) output from the singular value decomposition unit 3, and the system dimension n output from the system dimension determination unit 4a, and outputs the direct feedthrough term D$_d$ identified by the direct feedthrough term identification unit 1 and the system matrices A$_d$, B$_d$, and $C_d$ identified by the system matrix identification unit 5 as the linear discrete-time system that delineates the dynamic system.

In this way, the frequency response-based system identification device 60 of the present embodiment may convert an actual frequency response into an impulse response, and may eliminate trial and error from determination of a system dimension n, determine a system dimension n having a high conformity degree according to a weight function in the frequency domain with respect to an actual dynamic system, and identify the linear discrete-time system that delineates the dynamic system even when the singular value $\sigma_i$ (i=1, 2, 3, . . . ) of the block Hankel matrix $H_{kl}$ calculated from the impulse response gradually and monotonously decreases, and a boundary between a singular value having a significant value and a singular value corresponding to a minute value that can be ignored in identification is unclear.

In addition, the recursive system matrix estimation unit 31 may reduce the amount of computation for determining a system dimension n having a conformity degree with respect to the actual dynamic system.

Further, when a frequency response of a dynamic system is converted into an impulse response based on inverse Fourier transform, a linear discrete-time system that delineates the dynamic system may be accurately identified from an actual frequency response of the dynamic system.

In addition, when it is clear that an actual dynamic system is a stable system, a linear discrete-time system restricted to a stable system may be identified by the system stability evaluation unit 34.

The frequency response-based system identification device 60 of the present embodiment calculates a system characteristic of the linear discrete-time system as an estimated frequency response, and determines a minimum dimension among dimensions, at which the distribution 41 of the norms of the weighted sums of square errors in the frequency domain of the frequency response and the actual frequency response of the dynamic system is less than or equal to the threshold value 42 of the norm of the sum of square errors, to be a system dimension n. However, the invention is not limited thereto. A system characteristic of the linear discrete-time system may be calculated as an estimated impulse response, and a system dimension n may be determined based on the sum of square errors in the time domain of the impulse response and an actual impulse response obtained by inverse Fourier-transforming a frequency response of a dynamic system.

The system identification device, in which the system dimension determination unit 4a includes the system characteristic estimation unit 32 and the system dimension estimation unit 33, may eliminate trial and error from determination of a system dimension, determine a system dimension n having a high conformity degree in the frequency domain with respect to an actual dynamic system, and identify the linear discrete-time system that delineates the dynamic system even when the singular value of the block Hankel matrix calculated from an actual impulse response gradually and monotonously decreases, and a boundary between a singular value having a significant value and a singular value corresponding to a minute value that can be ignored is unclear. Here, the system characteristic estimation unit 32 calculates and outputs a system characteristic of the linear discrete-time system as the estimated frequency response with respect to each dimension belonging to the search range $n_i=(n_1, n_2, \ldots, n_a)$ (where $n_1<n_2<\ldots<n_a$), and the system dimension estimation unit 33 determines a minimum dimension among dimensions, at which the norm of the sum of square errors in the frequency domain of the estimated frequency response of the linear discrete-time system output from the system characteristic estimation unit 32 and the actual frequency response obtained by Fourier-transforming the impulse response is less than or equal to the threshold value 42, to be the system dimension, and outputs the system dimension.

The system dimension estimation unit 33 determines a weight function based on a Fourier-transformed actual frequency response, calculates a weighted value corresponding to a value obtained by multiplying the weight function by a square error value in the frequency domain of the estimated frequency response of the linear discrete-time system output from the system characteristic estimation unit 32 and the actual frequency response of the dynamic system, determines a minimum dimension among dimensions at which the norm of the weighted value is less than or equal to a threshold value to be a system dimension, and outputs the system dimension. Thus, the system identification device including the system dimension estimation unit 33 may eliminate trial and error from determination of a system dimension, determine a system dimension having a high conformity degree according to the weight function in the frequency domain with respect to an actual dynamic system, and identify the linear discrete-time system that delineates the dynamic system even when the singular value of the block Hankel matrix calculated from an actual impulse response gradually and monotonously decreases, and a boundary between a singular value having a significant value and a singular value corresponding to a minute value that can be ignored is unclear.

Fourth Embodiment

In the present embodiment, a description will be given of a case in which a dynamic system to be identified is a DC servomotor.

Figure 10:
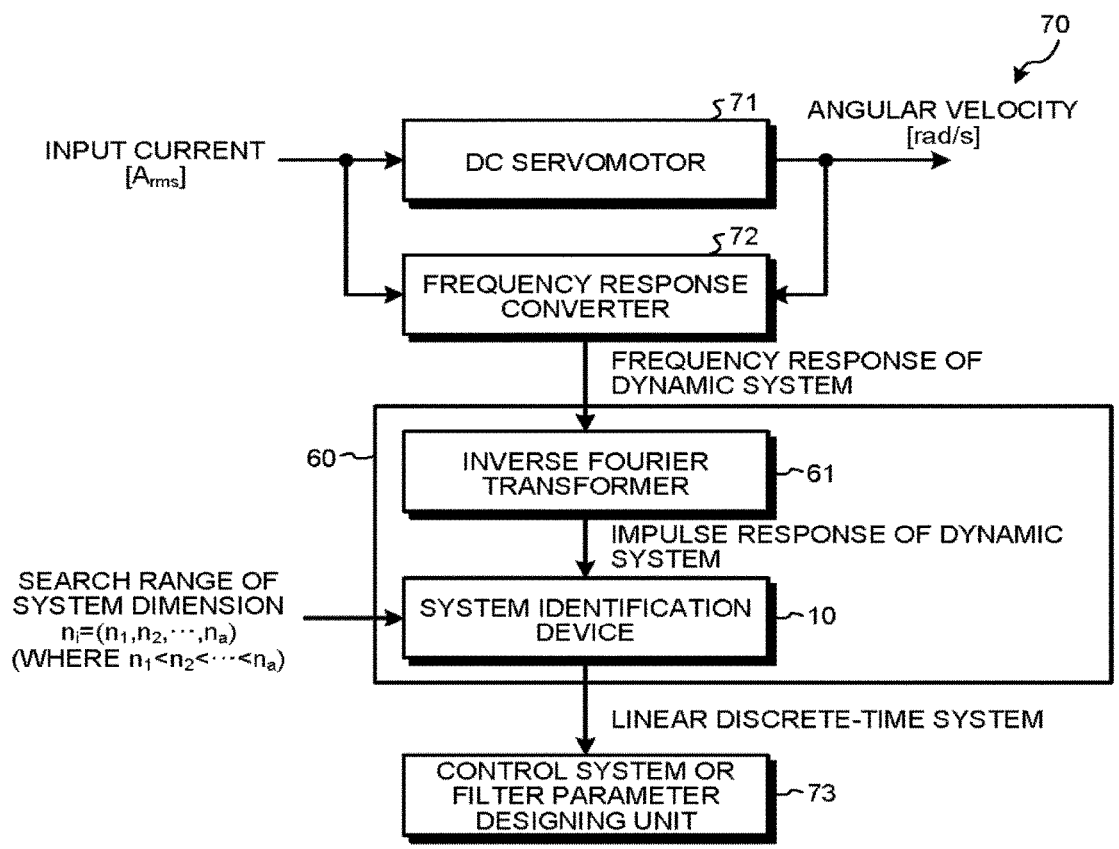
FIG. 10 is a block diagram illustrating a whole configuration of a system identification device according to a fourth embodiment.

FIG. 10 is a block diagram illustrating a whole configuration of a fourth embodiment of a system identification device according to the invention. The system identification device 70 according to the present embodiment includes a DC servomotor 71, a frequency response converter 72, a frequency response-based system identification device 60, and a control system or filter parameter designing unit 73. The frequency response-based system identification device 60 is identical to the frequency response-based system identification device described using FIG. 1 and FIG. 9 in the third embodiment.

In the present embodiment, for example, a sine sweep is input as an input current $[A_{rms}]$ of the DC servomotor 71, and the sine sweep is set as a system input. In addition, an angular velocity [rad/s] is obtained as a system output. The system input/output is converted into a frequency response $H(k\Delta f)$ by the frequency response converter 72. For example, the frequency response converter 72 outputs a frequency response based on Equation (28) below using fast Fourier transform (FFT), etc.

[Equation 28]

$$\text{Frequency response} = \frac{\text{Input/output spectrum}}{\text{Input power spectrum}} \quad (28)$$

The frequency response-based system identification device 60 sets the frequency response of the dynamic system and a search range of a system dimension as inputs, identifies a linear discrete-time system that delineates the dynamic system from the input current [$A_{rms}$] to the angular velocity [rad/s] of the DC servomotor 71, and outputs the identified linear discrete-time system to the control system or filter parameter designing unit 73. In this instance, the search range of the system dimension may be preferably set to have a sufficient width with respect to an estimated system dimension such as $n_i$=(1, 2, . . . , 50).

The frequency response-based system identification device 60 allows determination of a system dimension having a high conformity degree and identification of a linear discrete-time system that delineates a dynamic system with respect to an actual dynamic system. Thus, the linear discrete-time system may be used for a servomotor control system or filter parameter designing.

INDUSTRIAL APPLICABILITY

As described in the foregoing, the system identification device according to the invention is useful as an impulse response-based system identification device.

REFERENCE SIGNS LIST

1 direct feedthrough term identification unit, 2 block Hankel matrix generator, 3 singular value decomposition unit, 4, 4a system dimension determination unit, 5 system matrix identification unit, 10, 70 system identification device, 11 system input, 12 system output, 13 system input threshold value, 21 singular value distribution (in ideal impulse response), 22 singular value distribution (in actual impulse response), 31 recursive system matrix estimation unit, 32 system characteristic estimation unit, 33 system dimension estimation unit, 34 system stability evaluation unit, 41 distribution of norms of sums of square errors, 42 threshold value of norm of sum of square errors, 50 impulsive excitation-based system identification device, 51 system input application time specification unit, 52 impulse response converter, 60 frequency response-based system identification device, 61 inverse Fourier transformer, 71 DC servomotor, 72 frequency response converter, 73 control system or filter parameter designing unit.

The invention claimed is:

1. A system identification device, comprising:
processing circuitry configured to
measure an input and output of a dynamic system,
convert the measured input and output of the dynamic system to an impulse response of the dynamic system;
identify and output a direct feedthrough term of a linear discrete-time system delineating the dynamic system from the impulse response,
generate and output a block Hankel matrix from the impulse response,
output a first orthogonal matrix, a column vector of which corresponds to a left singular vector of the block Hankel matrix, a second orthogonal matrix, a column vector of which corresponds to a right singular vector of the block Hankel matrix, and a singular value of the block Hankel matrix through singular value decomposition of the block Hankel matrix output,
identify a system matrix excluding the direct feedthrough term in system matrices of the linear discrete-time system with respect to each dimension belonging to a designated search range of a system dimension based on the first orthogonal matrix, the second orthogonal matrix, the singular value, and the search range, and determine and output a system dimension from a comparison of a system characteristic of the linear discrete-time system calculated based on the system matrix and the direct feedthrough term and an actual system characteristic of the dynamic system,
identify a system matrix excluding the direct feedthrough term in system matrices of the linear discrete-time system based on the first orthogonal matrix, the second orthogonal matrix, the singular value, and the system dimension output, and
output the direct feedthrough term identified and the system matrix identified as the linear discrete-time system, wherein
the dynamic system corresponds to a DC servomotor, and
the processing circuitry is further configured to
determine a minimum dimension among dimensions, at which a difference between an estimated impulse response and the impulse response of the dynamic system converted from the measured input and output of the dynamic system is less than or equal to a threshold value defined by an allowed value of errors of the dynamic system, or
determine a minimum dimension among dimensions, at which a difference between an estimated frequency response and the impulse response of the dynamic system converted from the measured input and output of the dynamic system is less than or equal to a threshold value defined by an allowed value of errors of the dynamic system.

2. The system identification device according to claim 1, wherein the processing circuitry is configured to
calculate and output the system characteristic of the linear discrete-time system as the estimated impulse response with respect to each dimension belonging to the search range, and
determine the minimum dimension among dimensions, at which a norm of a sum of square errors in a time domain of the estimated impulse response output and an actual impulse response of the dynamic system is less than or equal to the threshold value, to be a system dimension, and output the system dimension.

3. The system identification device according to claim 2, wherein the threshold value is defined as a product of an allowed value of the sum of square errors and a minimum value of the norm of the sum of square errors.

4. The system identification device according to claim 1, wherein the processing circuitry is configured to
calculate and output the system characteristic of the linear discrete-time system as the estimated frequency response with respect to each dimension belonging to the search range, and
determine the minimum dimension among dimensions, at which a norm of a sum of square errors in a frequency domain of an estimated frequency response of the linear discrete-time system output and an actual frequency response obtained by Fourier-transforming the impulse response is less than or equal to the threshold value, to be a system dimension, and output the system dimension.

5. The system identification device according to claim 4, wherein the processing circuitry is configured to
determine a weight function based on the actual frequency response obtained by Fourier transform, and calculate a weighted value corresponding to a value obtained by multiplying the weight function by a square error value in the frequency domain of the estimated frequency response of the linear discrete-time system output and the actual frequency response of the dynamic system, determine the minimum dimension among dimensions at which a norm of the weighted value is less than or equal to the threshold value to be a system dimension, and output the system dimension.

6. The system identification device according to claim 5, wherein the threshold value is defined as a product of an allowed value of the sum of square errors and a minimum value of the norm of the sum of square errors.

7. The system identification device according to claim 4, wherein the threshold value is defined as a product of an allowed value of the sum of square errors and a minimum value of the norm of the sum of square errors.

8. The system identification device according to claim 1, wherein the processing circuitry is configured to identify a system matrix corresponding to a first dimension through a recursive method using an identification result of a system matrix corresponding to a second dimension lower than the first dimension by one level in the search range, and a left singular vector, a right singular vector, and a singular value, each of which corresponds to a dimension greater than the second dimension and less than or equal to the first dimension, from the first orthogonal matrix, the second orthogonal matrix, and the singular value.

9. The system identification device according to claim 1, wherein
information corresponding to the impulse response is a system input and a system output obtained when the dynamic system is stroke and vibrated,
the processing circuitry is configured to
specify a plurality of times at which the system input has significant values, and
set an added value of system inputs corresponding to the plurality of times output as an impulse input amplitude, and set a maximum value of the plurality of times output as an impulse input application time, thereby outputting a signal obtained by dividing a system output obtained after the impulse input application time by the impulse input amplitude as the impulse response, and
the linear discrete-time system is identified by setting the system input and the system output obtained when the dynamic system to be identified is stroke and vibrated, and the search range as inputs.

10. The system identification device according to claim 9, wherein the processing circuitry is configured to set a value obtained by multiplying a ratio threshold value by a maximum value of the system input as a system input threshold value, and specify times at which the system input is greater than or equal to the system input threshold value as a plurality of times at which the system input has significant values.

11. The system identification device according to claim 1, wherein information corresponding to the impulse response is a frequency response of the dynamic system,
the processing circuitry is configured to output a corresponding impulse response by inverse Fourier transform of the frequency response, and
the linear discrete-time system is identified by setting the frequency response of the dynamic system to be identified and the search range as inputs.

12. The system identification device according to claim 1, wherein the processing circuitry is configured to evaluate stability of the linear discrete-time system with respect to each dimension belonging to the search range, and a system dimension is determined from a system characteristic of the linear discrete-time system corresponding to a dimension at which the system is stable.

13. The system identification device according to claim 1, wherein the measured input of the dynamic system is an input current of a motor and the measured output of the dynamic system is an angular velocity of the motor obtained as the system output.

14. The system identification device according to claim 1, wherein the processing circuitry is configured to
measure the input and output of the dynamic system when the dynamic system is stroke and vibrated, the measured input of the dynamic system being an input current of a motor and the measured output of the dynamic system being an angular velocity of the motor obtained as the system output, and
determine stability of the linear discrete-time system with respect to each dimension belonging to the search range, a system dimension being determined from a system characteristic of the linear discrete-time system corresponding to a dimension at which the system is stable.

15. A system identification method comprising:
a measuring step of measuring an input and output of the dynamic system, the measured input and output of the dynamic system being measured when the dynamic system is stroke and vibrated;
a converting step of converting the measured input and output of the dynamic system to an impulse response of the dynamic system;
a direct feedthrough term identification step of identifying and outputting a direct feedthrough term of a linear discrete-time system delineating the dynamic system from the impulse response;
a block Hankel matrix generation step of generating and outputting a block Hankel matrix from the impulse response;
a singular value decomposition step of outputting a first orthogonal matrix, a column vector of which corresponds to a left singular vector of the block Hankel matrix, a second orthogonal matrix, a column vector of which corresponds to a right singular vector of the block Hankel matrix, and a singular value of the block Hankel matrix through singular value decomposition of the block Hankel matrix output from the block Hankel matrix step;
a system dimension determination step of identifying a system matrix excluding the direct feedthrough term in system matrices of the linear discrete-time system with respect to each dimension belonging to a designated search range of a system dimension based on the first orthogonal matrix, the second orthogonal matrix, the singular value, and the search range, and determining and outputting a system dimension from a comparison of a system characteristic of the linear discrete-time system calculated based on the system matrix and the direct feedthrough term and an actual system characteristic of the dynamic system;
a system matrix identification step of identifying a system matrix excluding the direct feedthrough term in system matrices of the linear discrete-time system based on the first orthogonal matrix, the second orthogonal matrix, the singular value, and the system dimension output from the system dimension determination step;

an output step of outputting the direct feedthrough term identified at the direct feedthrough term identification step and the system matrix identified at the system matrix identification step as the linear discrete-time system; and a determination step of determining a minimum dimension among dimensions, at which a difference between an estimated impulse response and the impulse response of the dynamic system converted from the measured input and output of the dynamic system is less than or equal to a threshold value defined by an allowed value of errors of the dynamic system, or a determination step of determining a minimum dimension among dimensions, at which a difference between an estimated frequency response and the impulse response of the dynamic system converted from the measured input and output of the dynamic system is less than or equal to a threshold value defined by an allowed value of errors of the dynamic system.

16. The system identification method according to claim 15, wherein the all steps are executed by processing circuitry.

17. A system identification device, comprising:
processing circuitry configured to
measure an input and output of the dynamic system;
convert the measured input and output of the dynamic system to an impulse response of the dynamic system,
identify and output a direct feedthrough term of a linear discrete-time system delineating the dynamic system from the impulse response,
generate and output a block Hankel matrix from the impulse response,
output a first orthogonal matrix, a column vector of which corresponds to a left singular vector of the block Hankel matrix, a second orthogonal matrix, a column vector of which corresponds to a right singular vector of the block Hankel matrix, and a singular value of the block Hankel matrix through singular value decomposition of the block Hankel matrix output,
identify a system matrix excluding the direct feedthrough term in system matrices of the linear discrete-time system with respect to each dimension belonging to a designated search range of a system dimension based on the first orthogonal matrix, the second orthogonal matrix, the singular value, and the search range, and determine and output a system dimension from a comparison of a system characteristic of the linear discrete-time system calculated based on the system matrix and the direct feedthrough term and an actual system characteristic of the dynamic system,
identify a system matrix excluding the direct feedthrough in system matrices of the linear discrete-time system based on the first orthogonal matrix, the second orthogonal matrix, the singular value, and the system dimension output, and
output the direct feedthrough term identified and the system matrix identified as the linear discrete-time system, wherein
the measured input and output of the dynamic system is measured when the dynamic system is stroke and vibrated, and
the processing circuitry is further configured to
determine a minimum dimension among dimensions, at which a difference between an estimated impulse response and the impulse response of the dynamic system converted from the measured input and output of the dynamic system is less than or equal to a threshold value defined by an allowed value of errors of the dynamic system, or
determine a minimum dimension among dimensions, at which a difference between an estimated frequency response and the impulse response of the dynamic system converted from the measured input and output of the dynamic system is less than or equal to a threshold value defined by an allowed value of errors of the dynamic system.

* * * * *